United States Patent
Arts et al.

(10) Patent No.: US 8,832,633 B2
(45) Date of Patent: Sep. 9, 2014

(54) GENERATING A CONVERGENT CIRCUIT DESIGN FROM A FUNCTIONAL DESCRIPTION USING ENTITIES HAVING ACCESS TO THE FUNCTIONAL DESCRIPTION AND TO PHYSICAL DESIGN INFORMATION

(71) Applicant: Oasys Design Systems, Inc., Santa Clara, CA (US)

(72) Inventors: Hermanus Arts, Saratoga, CA (US); Paul van Besouw, San Jose, CA (US); Johnson Limqueco, Fremont, CA (US)

(73) Assignee: Oasys Design Systems, San Jose, CA (US)

( * ) Notice: Subject to any disclaimer, the term of this patent is extended or adjusted under 35 U.S.C. 154(b) by 0 days.

(21) Appl. No.: 14/028,336

(22) Filed: Sep. 16, 2013

(65) Prior Publication Data
US 2014/0013289 A1   Jan. 9, 2014

Related U.S. Application Data

(62) Division of application No. 13/609,121, filed on Sep. 10, 2012, now Pat. No. 8,539,401, which is a division of application No. 11/652,244, filed on Jan. 10, 2007, now Pat. No. 8,302,042.

(60) Provisional application No. 60/833,102, filed on Jul. 24, 2006.

(51) Int. Cl.
G06F 17/50   (2006.01)

(52) U.S. Cl.
USPC ............ 716/132; 716/105; 716/122; 716/126

(58) Field of Classification Search
USPC .................... 716/105, 122, 126, 132
See application file for complete search history.

(56) References Cited

U.S. PATENT DOCUMENTS

| | | | |
|---|---|---|---|
| 5,892,687 A | 4/1999 | Moricz et al. | |
| 5,920,486 A * | 7/1999 | Beahm et al. | 716/102 |
| 6,080,204 A | 6/2000 | Mendel | |
| 6,145,117 A | 11/2000 | Eng | |
| 6,286,128 B1 | 9/2001 | Pileggi et al. | |
| 6,360,356 B1 * | 3/2002 | Eng | 716/105 |
| 6,477,698 B1 * | 11/2002 | Shalish | 716/105 |
| 6,505,328 B1 | 1/2003 | Van Ginneken et al. | |

(Continued)

OTHER PUBLICATIONS

Hulen, Martin; "Circuit Partioning with Genetic Algorithms Using a Coding Scheme to Preserve the Structure of a Circuit," In Proceedings of Parallel Problem Solving from Nature (PPSN); Dortmund, Germany, Oct. 1-3, 1990; pp. 75-79.

*Primary Examiner* — Naum Levin

(57) ABSTRACT

A method of designing a circuit is described. In an embodiment, a physical design implementation for the circuit is created using a plurality of entities. These entities are named "genomes". Each entity includes a portion of a functional description of the circuit that has been synthesized into a gate-level implementation. An entity is selected to facilitate the physical design implementation meeting a plurality of design constraints. Several steps (e.g., beginning with selection of an entity) of this method are repeated several times to meet the design constraints. As a consequence, the physical design implementation provides more accurate information for use in a final physical design implementation. Moreover, the physical design implementation can be created faster than prior techniques while still allowing a global view of the physical design implementation in meeting design constraints.

20 Claims, 14 Drawing Sheets

(56) References Cited

U.S. PATENT DOCUMENTS

| | | | |
|---|---|---|---|
| 6,530,073 B2 | 3/2003 | Morgan | |
| 6,557,145 B2 | 4/2003 | Boyle et al. | |
| 6,622,291 B1 * | 9/2003 | Ginetti | 716/108 |
| 6,622,292 B2 * | 9/2003 | Miyazaki et al. | 716/105 |
| 6,631,508 B1 | 10/2003 | Williams | |
| 6,845,494 B2 | 1/2005 | Burks et al. | |
| 6,898,767 B2 * | 5/2005 | Halstead | 716/103 |
| 7,013,438 B1 | 3/2006 | Saldanha et al. | |
| 7,069,523 B2 | 6/2006 | Nation et al. | |
| 7,073,149 B2 | 7/2006 | Knol et al. | |
| 7,120,892 B1 | 10/2006 | Knol et al. | |
| 7,260,808 B1 * | 8/2007 | Pasqualini | 716/104 |
| 7,275,232 B2 | 9/2007 | Schleicher et al. | |
| 7,401,310 B1 | 7/2008 | Thaden et al. | |
| 7,451,427 B2 | 11/2008 | Varadarajan | |
| 2002/0178432 A1 * | 11/2002 | Kim et al. | 716/18 |
| 2002/0188922 A1 * | 12/2002 | Ginneken et al. | 716/18 |
| 2003/0009734 A1 | 1/2003 | Burks et al. | |
| 2005/0108665 A1 | 5/2005 | Neves et al. | |
| 2005/0268268 A1 | 12/2005 | Wang et al. | |

* cited by examiner

200

FUNCTIONAL DESCRIPTION LEVEL — 210

GENOME LEVEL — 220

GATE LEVEL — 230

RESYNTHESIS OF GENOME G6

MERGE GENOMES

SPLIT GENOME

MOVE GENOMES

SPLIT AND MERGE GENOMES

RESIZE THE GENOMES

GENERATING A CONVERGENT CIRCUIT DESIGN FROM A FUNCTIONAL DESCRIPTION USING ENTITIES HAVING ACCESS TO THE FUNCTIONAL DESCRIPTION AND TO PHYSICAL DESIGN INFORMATION

CROSS-REFERENCE TO RELATED APPLICATIONS

This application is a Divisional of and claims priority to U.S. patent application Ser. No. 13/609,121, filed on Sep. 10, 2012 and now issued as U.S. Pat. No. 8,539,401, which is a Divisional of and claims priority to U.S. patent application Ser. No. 11/652,244, filed on Jan. 10, 2007 and now issued as U.S. Pat. No. 8,302,042, which claims the benefit of and priority to U.S. Provisional Application No. 60/833,102, filed on Jul. 24, 2006, which are hereby incorporated by reference in their entirety.

FIELD

Embodiments of the present invention generally relate to integrated circuit design. More particularly, embodiments of the present invention relate to computer systems and software tools for generating a convergent circuit design from a functional description using entities having access to the functional description and to physical design information.

BACKGROUND

Improvements in chip fabrication process technologies enable fabrication of integrated circuits (or circuits) with millions of components. Design of these circuits is complex and time-consuming. Various tools have been developed to automate the circuit design process. The purpose of these tools is to generate a convergent circuit design, which is a circuit design that meets the specified design constraints (e.g., power, area, timing, functionality, etc.).

Typically, the circuit design process is initiated by creation of the functional description of the desired circuit in a high-level language. This functional description is translated or converted to a gate-level implementation using cells (e.g., standard cells) from a given process technology library. This translation process is referred to as synthesis. The gates from synthesis are then placed and routed with the intent to create a physical design layout that meets specified design constraints. Further, the physical design layout is utilized to fabricate the desired circuit.

Although generation of a convergent circuit design is the goal, the gate-level implementation may lead to a non-convergent circuit design despite much effort to generate the convergent circuit design. Typical corrective action by the design team focuses on changing the functional description and performing synthesis again to generate a new gate-level implementation. However, there is no guarantee that the change in the functional description will lead to the convergent circuit design. Multiple iterations of this corrective action are typically required, increasing costs and causing major delays.

Further exacerbating this problem is that the capacity of the circuit design automation tools is being overwhelmed by the growing complexity of and the growing number of components in desired circuits fabricated on semiconductor chips. This has lead to dividing the circuit design into logical blocks that the circuit design automation tools can handle and to budgeting the design constraints among the logical blocks. Each logical block is designed independently. When the logical blocks are brought back together as a circuit on a chip, design constraints met at the logical block level may no longer be met at the global or chip level.

Many prior art tools and approaches to synthesizing a gate-level implementation using statistical wireload models and then placing and routing the gate-level implementation in two separate steps is no longer adequate with the newer process technologies due to the inaccuracy of the wireload models used during synthesis. This is the reason for the non-convergence described above. More recent prior art tools and approaches attempt to solve this problem by performing some gate-level optimization during place and route. This approach is typically referred to as physical synthesis. However, the ability of physical synthesis to drastically alter the gate-level implementation is fairly limited because it manipulates detailed gates without knowledge of design functionality.

Another approach to achieving a convergent circuit design has focused on creating a prototype physical design implementation using a library of predefined and precharacterized blocks before synthesizing the gate-level implementation. This library is created without any design-specific information. The functional description of a design is mapped into these predefined and precharacterized blocks. A prototype physical design implementation is created using the predefined and precharacterized blocks to meet various design constraints. Since these predefined and precharacterized blocks did not use any design-specific information and their characteristics can vary greatly from the gates eventually synthesized to implement the design, the prototype physical design implementation often does not correlate well with the final physical design implementation and thus, may not lead to a convergent circuit design.

SUMMARY

Accordingly, a method of designing an integrated circuit is described. In an embodiment, a functional description of the circuit is received. A plurality of entities based on the functional description are created. These entities are named "genomes". The entities are at a design level that is lower than a functional description level and that is higher than a gate-level. Further, the entities are used to create a physical design implementation for the circuit that meets a plurality of design constraints.

In another embodiment, a method of designing a circuit includes receiving a functional description of the circuit. The functional description is partitioned into a plurality of entities based on a plurality of rules. These entities are named "genomes". Moreover, the functional description of each entity is synthesized into a gate-level implementation. The entities are used to create a physical design implementation for the circuit that meets a plurality of design constraints.

In yet another embodiment, a method of designing a circuit includes placing and routing a plurality of entities to create a physical design implementation for the circuit. These entities are named "genomes". Each entity includes a portion of a functional description of the circuit that has been synthesized into a gate-level implementation. The entities are manipulated to facilitate the physical design implementation meeting a plurality of design constraints. The manipulating step includes using information from the physical design implementation to ensure meeting the plurality of design constraints.

In still another embodiment, a physical design implementation for the circuit is created using a plurality of entities. These entities are named "genomes". Each entity includes a portion of a functional description of the circuit that has been synthesized into a gate-level implementation. An entity is selected to facilitate the physical design implementation meeting a plurality of design constraints. The functional description associated with the selected entity is accessed. Moreover, information associated with the physical design implementation is accessed. The functional description associated with the selected entity is resynthesized into a new gate-level implementation that takes into account the information associated with the physical design implementation. The resynthesized entity is used in the physical design implementation. Several steps (e.g., beginning with selection of an entity) of this method are repeated several times to meet the design constraints.

As a consequence, the physical design implementation provides more accurate information for use in a final physical design implementation. Moreover, the physical design implementation may be created faster than prior techniques while still allowing a global view of the physical design implementation in meeting design constraints.

Another embodiment is directed to an electronic design tool that has a functional description analyzer configured to facilitate partitioning a functional description of a circuit into a plurality of entities based on a plurality of rules. These entities are named "genomes". The electronic design tool also includes an entity engine configured to create and manage a plurality of entities, wherein each entity includes a portion of the functional description of the circuit that has been synthesized into a gate-level implementation. Furthermore the electronic design tool embodiment also includes a physical design engine embodiment that places and routes the entities to create a physical design implementation that meets the design constraints.

More specifically, an embodiment of the present invention includes a method of designing an integrated circuit, comprising: receiving a functional description of the integrated circuit; partitioning the functional description into a plurality of entities based on a plurality of rules; synthesizing the functional description of each entity into a gate-level implementation; and using the plurality of entities to create a physical design implementation for the integrated circuit that satisfies a plurality of design constraints. Embodiments include the above and wherein the using the plurality of entities to create a physical design implementation for the integrated circuit further includes: performing integrated circuit chip level analysis for area, timing and power constraints using aggregate characteristics of the plurality of entities; and modifying the plurality of entities using the integrated circuit chip level analysis to satisfy the design constraints.

Embodiments are also directed toward method of designing an integrated circuit, comprising: placing and routing a plurality of entities to create a physical design implementation for the integrated circuit, wherein each entity of the plurality of entities includes a portion of a functional description of the integrated circuit that has been synthesized into a gate-level implementation; and manipulating the plurality of entities to facilitate the physical design implementation satisfying a plurality of design constraints, wherein the manipulating includes using physical design information of the physical design implementation to ensure satisfying the plurality of design constraints. Embodiments include the above and wherein the manipulating the plurality of entities further includes: performing integrated circuit chip level analysis for area, timing and power constraints using aggregate characteristics of the plurality of entities; and modifying the plurality of entities using the integrated circuit chip level analysis to satisfy the design constraints.

Embodiments are also directed toward a method of designing an integrated circuit, comprising: creating a physical design implementation for the integrated circuit using a plurality of entities, wherein each entity of the plurality of entities includes a portion of a functional description of the integrated circuit that has been synthesized into a gate-level implementation; selecting an entity to facilitate the physical design implementation meeting a plurality of design constraints; accessing the functional description associated with the selected entity; accessing information associated with the physical design implementation; resynthesizing the functional description associated with the selected entity into a new gate-level implementation that takes in account the information associated with the physical design implementation; and using the resynthesized entity in the physical design implementation. Embodiments include the above and wherein the resynthesizing the functional description further includes: performing integrated circuit chip level analysis for area, timing and power constraints using aggregate characteristics of the plurality of entities; and modifying the plurality of entities using the integrated circuit chip level analysis to satisfy the design constraints.

Embodiments are also directed toward a method of designing an integrated circuit, comprising: receiving a functional description of the integrated circuit; creating a plurality of entities based on the functional description, wherein the entities are at a design level that is lower than a functional description level and that is higher than a gate-level wherein further the plurality of entities are operable to access the functional description and physical design information related to the integrated circuit; and using the entities to create a physical design implementation for the integrated circuit that satisfies a plurality of design constraints wherein the physical design information is of the physical design implementation.

Embodiments are also directed toward an electronic design tool comprising: a functional description analyzer configured to facilitate partitioning a functional description of an integrated circuit into a plurality of entities based on a plurality of rules; an entity engine configured to create and manage a plurality of entities, wherein each entity includes a portion of the functional description of the integrated circuit that has been synthesized into a gate-level implementation.

BRIEF DESCRIPTION OF THE DRAWINGS

The accompanying drawings, which are incorporated in and form a part of this specification, illustrate embodiments and, together with the description, serve to explain the principles of the disclosure.

DETAILED DESCRIPTION

Reference will now be made in detail to embodiments, examples of which are illustrated in the accompanying drawings. While the disclosure will be described in conjunction with embodiments, it will be understood that they are not intended to limit the disclosure to these embodiments. On the contrary, the disclosure is intended to cover alternatives, modifications and equivalents, which may be included within the spirit and scope of the disclosure as defined by the appended claims. Furthermore, in the following detailed description of embodiments, numerous specific details are set forth in order to provide a thorough understanding of the disclosure. However, it will be recognized by one of ordinary skill in the art that the disclosure may be practiced without these specific details. In other instances, well-known methods, procedures, components, and circuits have not been described in detail as not to unnecessarily obscure aspects of the embodiments.

Figure 10:
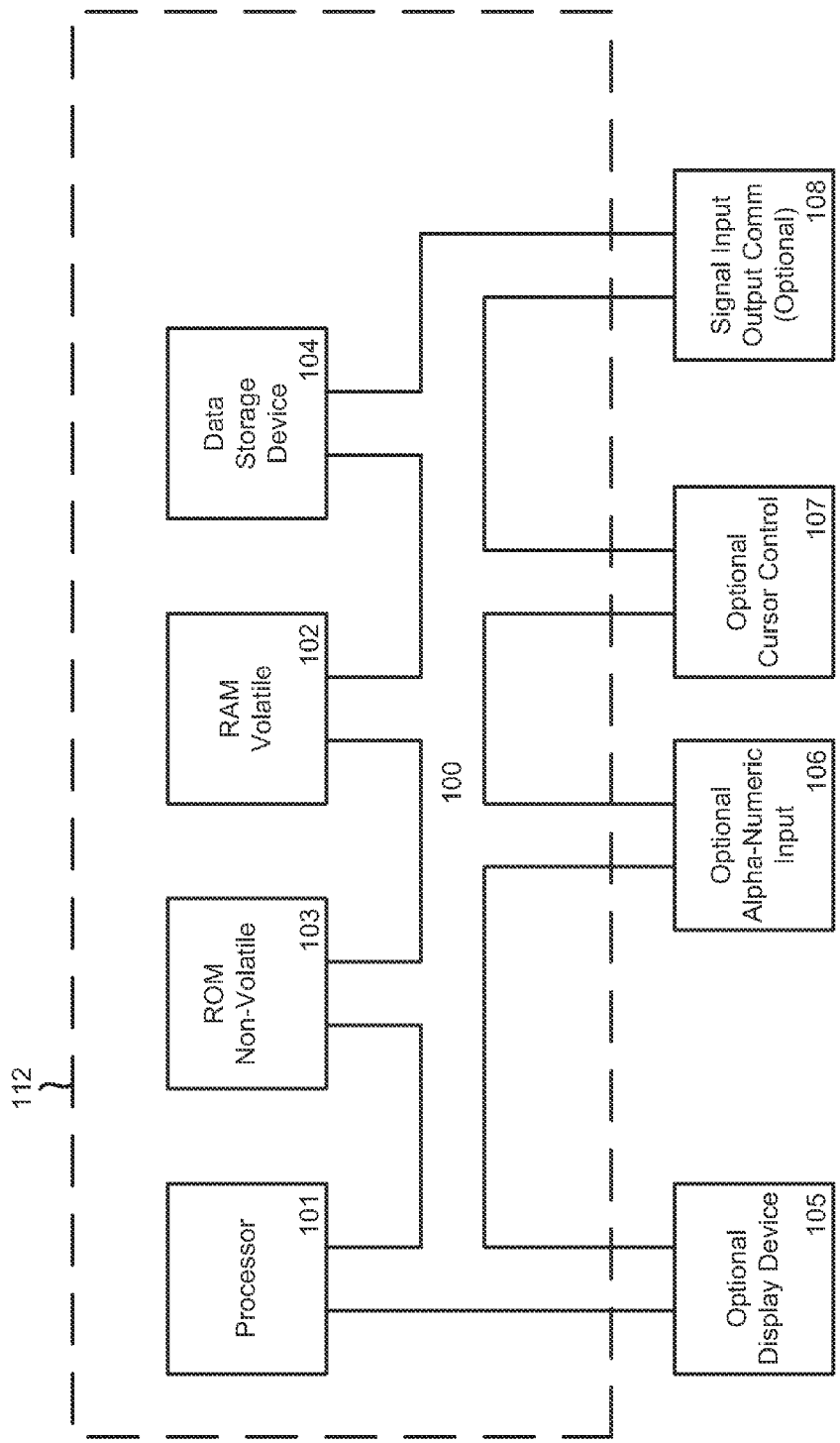
FIG. 10 is an illustration of a general purpose computer system which may serve as a platform for implementing various embodiments of the present invention.

Some portions of the detailed descriptions, which follow (e.g., FIGS. 1C, 4, 6A, 6B, for instance), are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system (e.g., as shown in FIG. 10). It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the invention, discussions utilizing terms such as "recognizing" or "initiating" or "conveying" or "embedding" or "coupling" or "accessing" or "identifying" or "receiving" or "outputting" or "generating" or "determining" or "associating" or "storing" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In contrast to the deficiencies of the circuit design flow described above, embodiments of the present invention are directed to an electronic design tool and method for generating a convergent circuit design faster than previously possible by focusing on quickly creating a physical design implementation (e.g., physical layout) from the functional description of the circuit after the functional description becomes available and by maintaining a link between the functional description and the physical design implementation. This enables identification of physical design information of the physical design implementation that helps in resynthesizing the functional description in a manner that is effective in correcting problems so that design constraints (e.g., area, power, timing, etc.) are met. Further, the physical design implementation is created in a manner that allows the physical design to be tuned as a whole to meet the design constraints instead of trying to meet the design constraints by budgeting the design constraints among numerous divisions of the physical design.

Figure 1A:
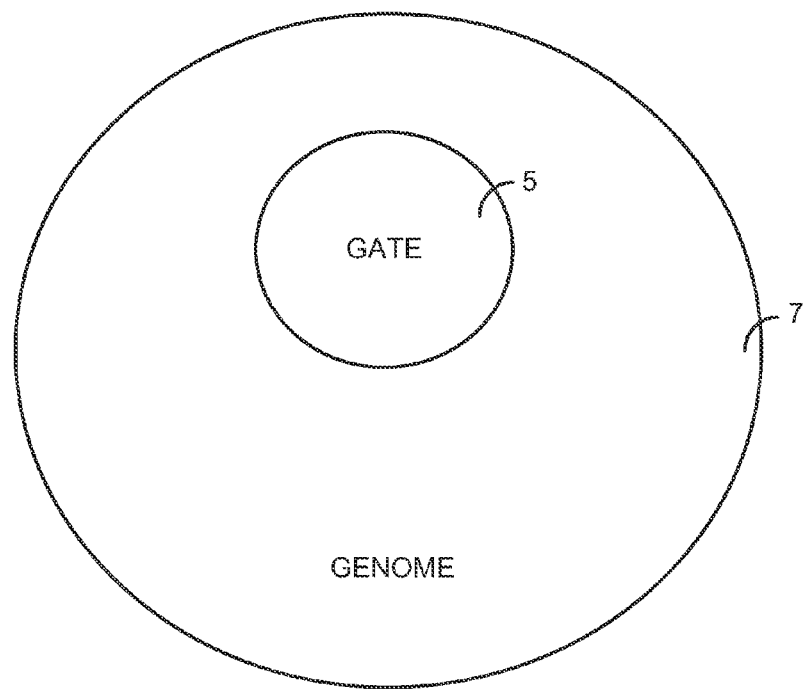
FIG. 1A illustrates relation of genome and gate in accordance with an embodiment of the present invention.

FIG. 1A illustrates relation of a genome 7 and its associated gates 5 in accordance with an embodiment of the present invention. As will be described in detail below, a plurality of entities are created based on the functional description of a circuit. These entities are referred to as "genomes". The genomes are utilized to create a physical design implementation for the circuit that meets various design constraints (e.g., area, power, timing, etc.). If the design constraints are met, information from the created physical design implementation can be used for creating a final physical design implementation for the circuit.

The genome 7 and its associated gates 5 originate from the functional description of the circuit. Moreover, the genome 7 provides a higher-level of abstraction for creating the physical design implementation for the circuit. However, the genome 7 depends on the gates 5 for determination of the genome's 7 characteristics in analyzing various design constraints. That is, the genome 7 uses the characteristics of its synthesized gates 5 for determination of the genome's 7 characteristics. Since the gate-level implementation information is information that is actually used in the physical design implementation, use of the genomes results in a physical design implementation that provides more accurate information (e.g., area, power, timing, etc.) in relation to the final physical design implementation. Moreover, the genome's 7 higher-level of abstraction leads to a reduction in the amount of information handled to achieve a convergent circuit design. Consequently, the physical design implementation can be created in a shorter length of time and a global view of the physical design implementation is available for meeting the design constraints.

This global view of the physical design implementation allows wire characteristics (such as capacitance, delay, etc.) between genomes to be calculated with a more accurate physical view allowing design constraints to be met with a higher degree of accuracy and better convergence. This is in contrast with the traditional approach of using statistical wireload models, which have proven to be highly inaccurate and which is the primary reason for non-convergent circuit designs.

Figure 1B:
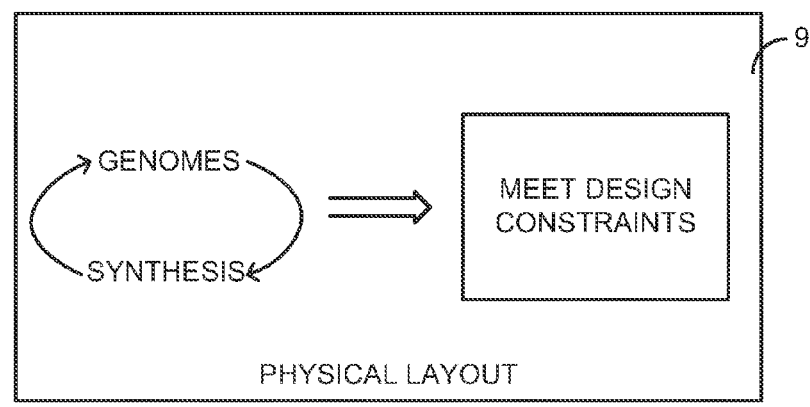
FIG. 1B illustrates relation of genomes and physical design implementation in accordance with an embodiment of the present invention.

FIG. 1B illustrates the relation of genomes and physical design implementation 9 in accordance with an embodiment of the present invention. As will be described in detail below, the functional description of the circuit is partitioned into a plurality of genomes. The functional description of each genome is synthesized into the gate-level implementation using cells (e.g., standard cells) from a given process technology library. Moreover, each genome maintains a link to its functional description. The genomes are utilized to create the physical design implementation 9 for the circuit that meets various design constraints (e.g., area, power, timing, etc.). The size of the genomes is prevented from being a size at which the effect of routing metal wire between the gates within the genomes is not negligible in meeting the design constraints.

As depicted in FIG. 1B, creation of the physical design implementation 9 that meets various design constraints (e.g., area, power, timing, etc.) requires the genomes to undergo one or more synthesis iterations. For instance, the functional description associated with a selected genome is accessed. Further, the functional description associated with the selected genome is resynthesized into a new gate-level implementation that takes into account information associated with the physical design implementation 9. That is, the genomes are adaptive to changes necessary to achieve a convergent circuit design.

Figure 1C:
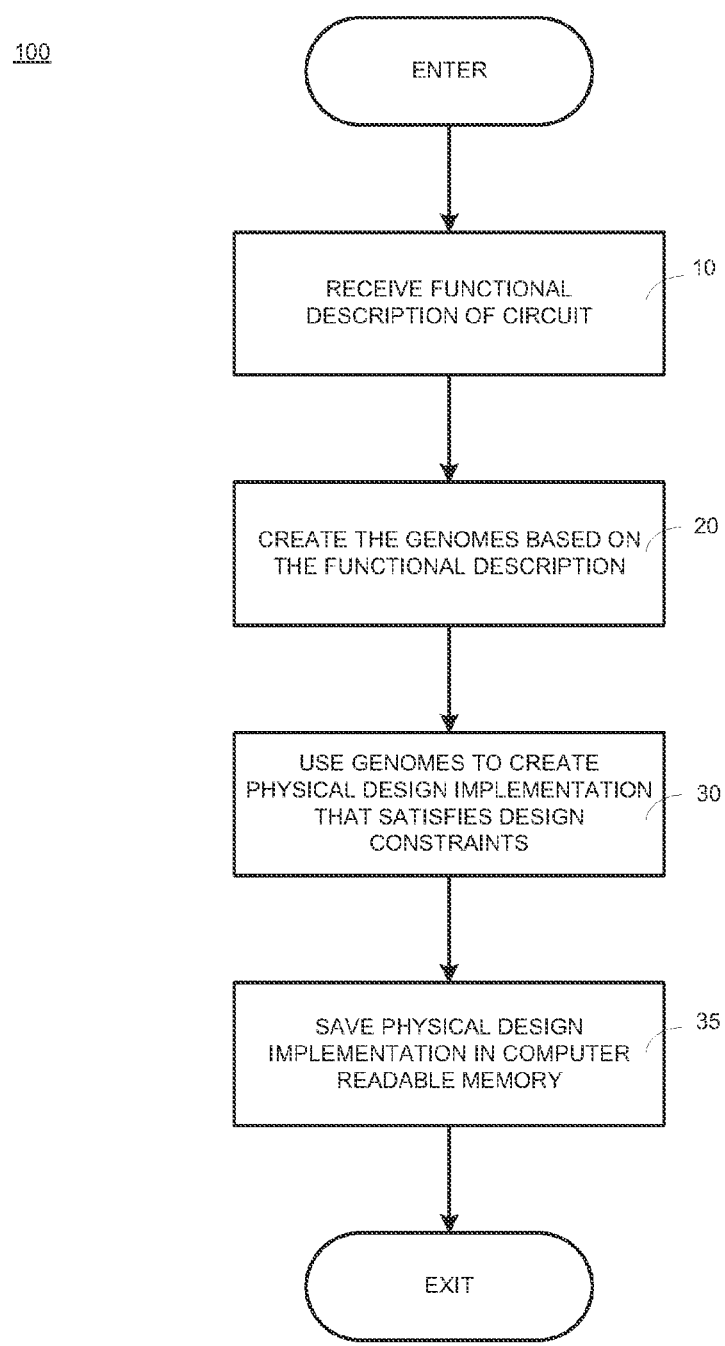
FIG. 1C illustrates an exemplary flow diagram showing a method of designing a circuit in accordance with an embodiment of the present invention.

FIG. 1C illustrates an exemplary computer controlled flow chart 100 showing a method of designing a circuit in accordance with an embodiment of the present invention. In an embodiment, the electronic design tool 1000 (FIG. 9) performs flow chart 100. It is appreciated that flow chart 100 may be implemented in accordance with a computer system executing software to realize the various functions described herein.

At Block 10, the functional description of the circuit is received. The functional description may be a Register Transfer Level description written in a high-level language such as Verilog, VHDL, or any other suitable language.

Figure 2:
FIG. 2 illustrates multiple design levels in accordance with an embodiment of the present invention.
Figure 2:
Figure 4:
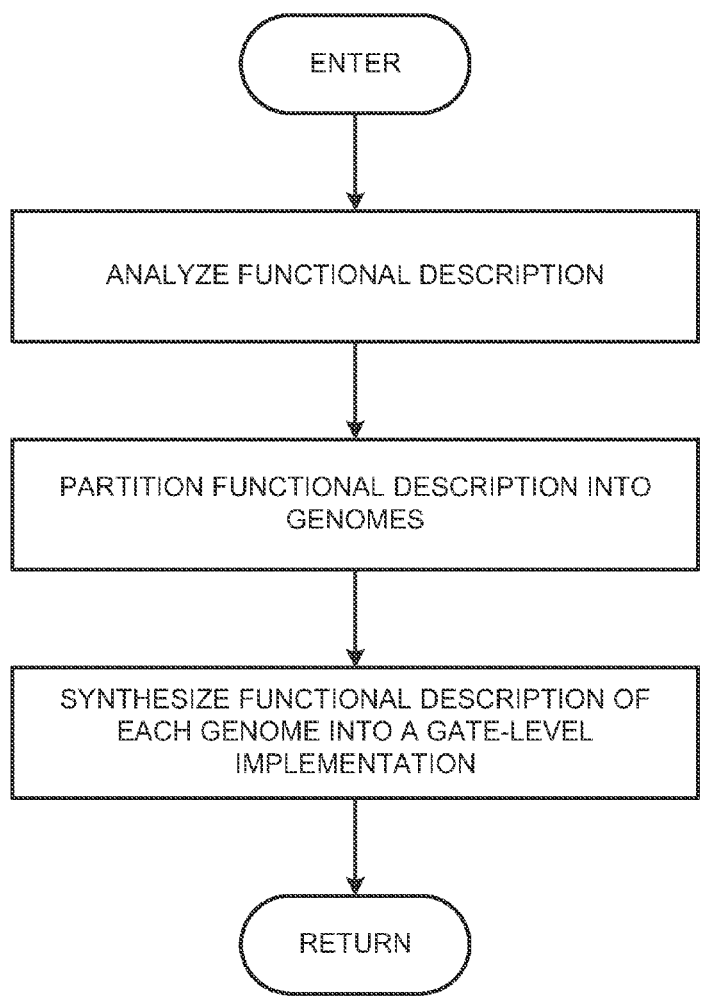
FIG. 4 illustrates an exemplary flow diagram showing creation of genomes-in accordance with an embodiment of the present invention.

Continuing, at Block 20, a plurality of entities are created based on the functional description. FIG. 4 provides details of Block 20. These entities are referred to as "genomes". Now focusing on FIG. 2, which illustrates multiple design levels in accordance with an embodiment of the present invention, the design level (genome level 220) of the genomes is lower than the functional description level 210 but higher than the gate-level 230. That is, the genomes enable circuit design to take place at a level that is sufficiently suitable for physical design layout and that does not require handling a vast amount of design information, as in the case of circuit design at the gate-level 230. This allows faster knowledge of whether the functional description leads to a convergent circuit design and reduces the amount of time needed to determine whether corrective action such as resynthesis of functional description (of the functional description level 210) to meet design constraints is effective or ineffective. Moreover, the genome level 220 has links to both the functional description level 210 and the gate-level 230.

Figure 3:
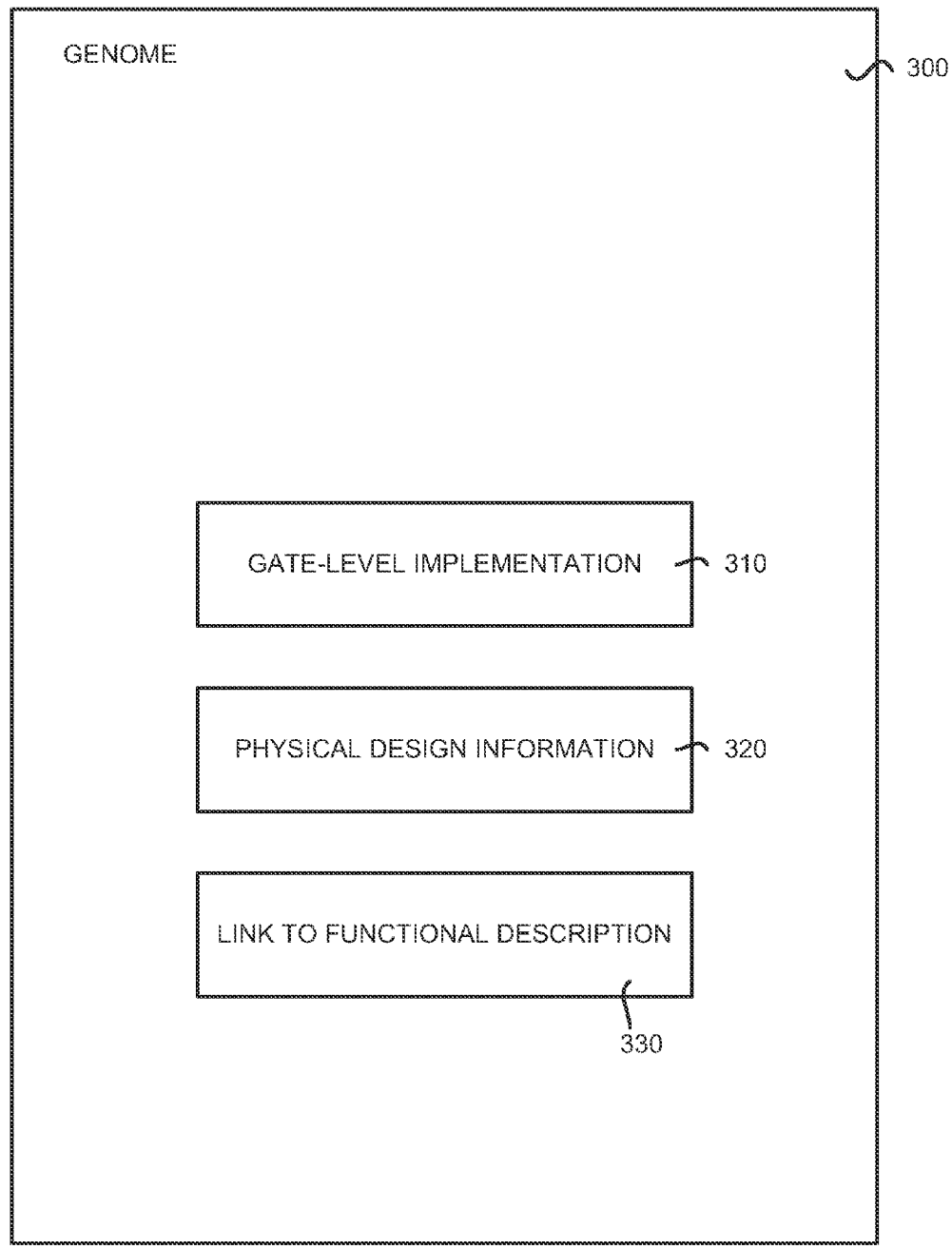
FIG. 3 illustrates an exemplary genome in accordance with an embodiment of the present invention.

Referring now to FIG. 3, a genome 300 is illustrated in accordance with an embodiment of the present invention. As depicted in FIG. 3, the genome 300 may include a gate-level implementation 310, physical design information 320, and a link 330 to the functional description. Moreover, the genome 300 is dynamic and adaptive as will be discussed below.

The functional description of the circuit described at Block 10 of FIG. 1C is examined to identify suitable partitioning of the functional description into a plurality of genomes. The functional description of each genome is synthesized (synthesis is performed) into the gate-level implementation 310 using cells (e.g., standard cells) from a given process technology library. That is, the gate-level implementation 310 determines gate-level parameters usable for the process of meeting various design constraints (e.g., area, power, timing, etc.). The parameters of the genome 300 usable for the process of meeting design constraints represent an aggregate of the gate-level parameters of the gate-level implementation 310. The physical design information 320 may include placement of the gates from the gate-level implementation 310 within the genome 300 in a physical design implementation (or physical layout). The link 330 is to the functional description synthesized into the gate-level implementation 310 of the genome 300.

With reference to FIG. 4, an exemplary computer controlled flow chart 20 is illustrated that shows creation of genomes in accordance with an embodiment of the present invention is illustrated. It is appreciated that flow chart 20 may be implemented in accordance with a computer system executing software to realize the various functions described herein. In an embodiment, the electronic design tool 1000 (FIG. 9) performs flow chart 20. At Block 410, the functional description of the circuit described at Block 10 of FIG. 1C is analyzed to identify suitable partitioning of the functional description based on a plurality of rules. The rules include heuristic-based rules, placement-based rules, module-based rules, function-based rules, datapath operator-based rules, maximum size-based rules, minimum size-based rules, and other types of rules.

In general, the rules are intended to partition the functional description such that when synthesized into the gate-level implementation, favorable placement of the gate-level implementation is achievable. For example, functional description of the genome may be a complex function, a datapath operator such as an adder, or simply functional description corresponding to a few logic gates.

Continuing at Block 420, the functional description is partitioned into a plurality of genomes based on the rules discussed above. At Block 430, the functional description of each genome is synthesized into the gate-level implementation 310 (FIG. 3).

Figure 5:
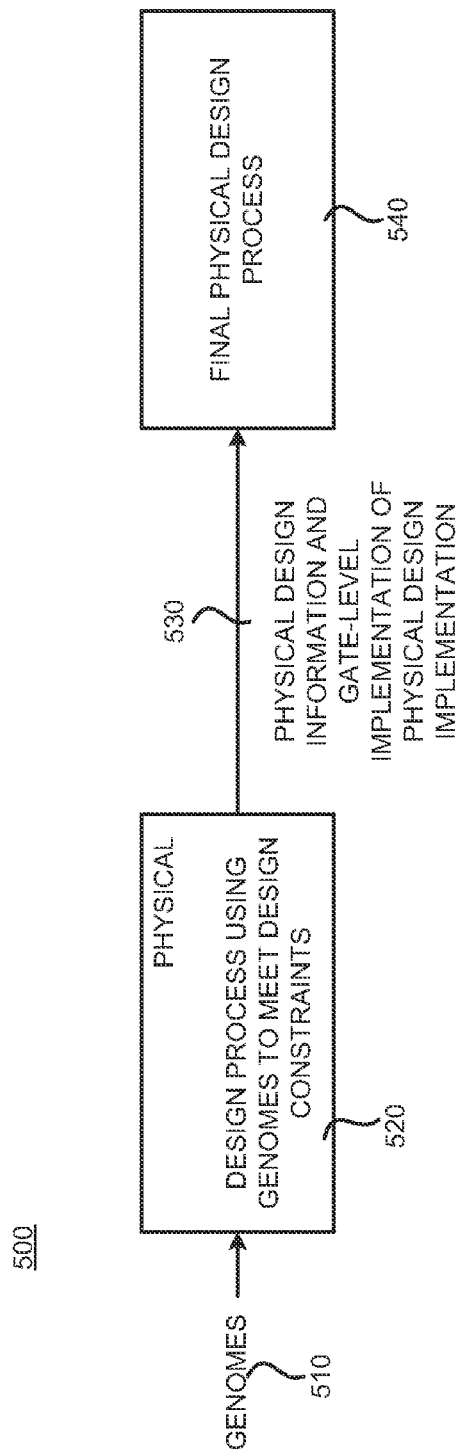
FIG. 5 illustrates a circuit design flow based on genomes in accordance with an embodiment of the present invention.

Now referring to FIG. 5, which illustrates an exemplary circuit design flow 500 based on genomes in accordance with an embodiment of the present invention, the genomes 510 are utilized in a physical design process 520. The objective of the physical design process 520 is to create a physical design implementation that meets design constraints (e.g., power, timing, area, etc.). During the physical design process 520, efficient and flexible trade-offs can be made since the genomes 510 provide links to the functional description, enabling resynthesis of functional description into a new gate-level implementation that takes into account information associated with the physical design implementation. Design constraints and physical design information are examples of information associated with the physical design implementation. The genomes 510 have parameters (such as area, timing, power, etc.), representing an aggregate of the gate-level parameters of the gate-level implementation of the respective genome, usable for the process of meeting design constraints. These genome parameters are also examples of information associated with the physical design implementation that is taken into account when resynthesizing the functional description to meet design constraints.

Also, the genomes 510 enable the physical design process 520 to meet the design constraints by providing a global (or chip) level view of the physical design implementation and its properties (e.g., timing, power, area, etc.), which need to meet the design constraints. This is possible because there are less genomes 510 than gates to take into consideration when determining whether the design constraints are met. For example, hundreds or thousands of genomes 510 may represent a circuit design of millions of gates.

After the design constraints are met, information 530 that includes a gate-level implementation (or gate-level netlist) and physical design information (e.g., placement of gates within the genomes 510 in the physical design implementation) of the physical design implementation from the physical design process 520 may be furnished to physical design tools such as place-and-route tools of the final physical design process 540. As a result, a convergent circuit design is achieved in a shorter time period and at a lower cost than previously possible.

Figure 6A:
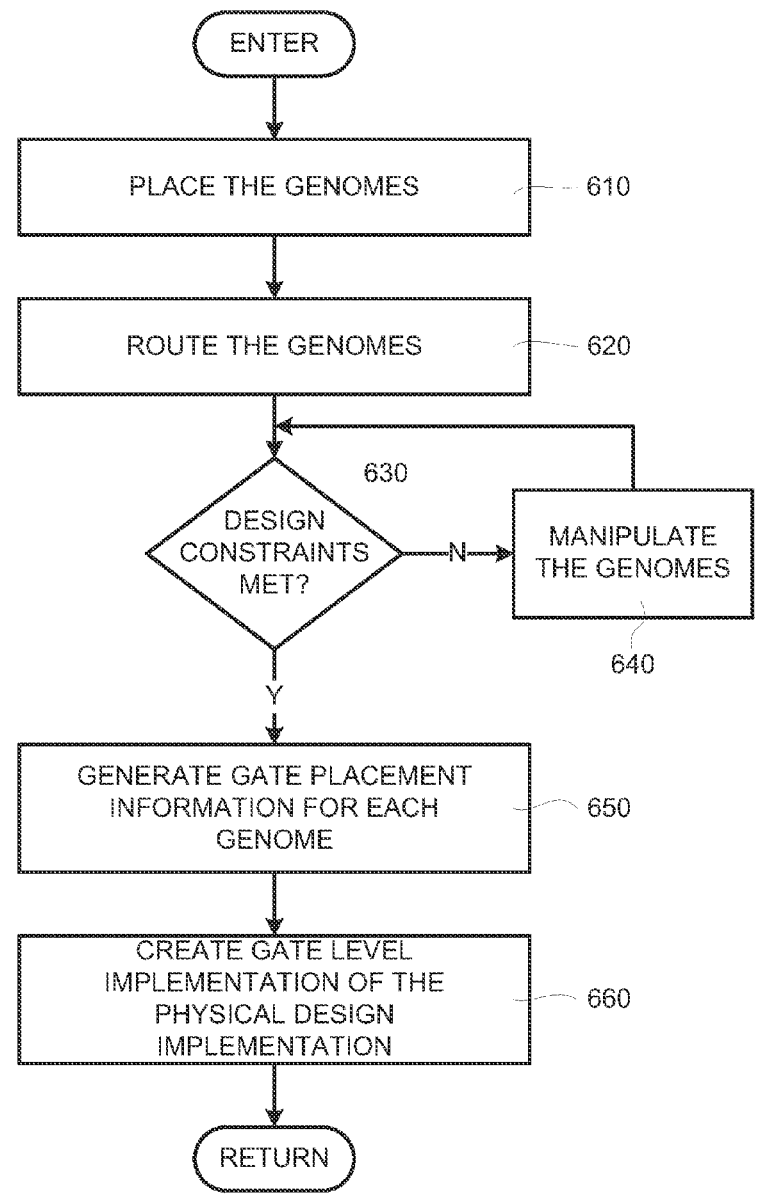
FIG. 6A illustrates an exemplary flow diagram showing use of genomes in accordance with an embodiment of the present invention.

Returning to FIG. 1C, at Block 30 the genomes are used to create a physical design implementation that meets the design constraints (e.g., power, area, timing, etc.). FIG. 6A provides details of Block 30. The genomes 510 have parameters, representing an aggregate of the gate-level parameters of the gate-level implementation of the respective genome, usable for the process of meeting design constraints. In an embodiment, physical design parameters (e.g., floorplan information) for a final physical design implementation are received. These physical design parameters are used to create the physical design implementation so that the physical design implementation correlates with the final physical design implementation to a greater extent.

Moreover, use of the genomes to create the physical design implementation facilitates validating that the design constraints can be met for enabling development of prototypes faster than without use of the genomes.

If the design constraints are met, a gate-level implementation (or gate-level netlist) of the physical design implementation and physical design information (e.g., placement of gates within the genomes in the physical design implementation) of the physical design implementation may be delivered to tools to perform place and route operations for a final physical design implementation for the circuit. Also, if the design constraints are met, physical design information (e.g., placement of gates within the genomes in the physical design implementation) of the physical design implementation may be used to perform floorplan operations, to determine how the logic blocks should be partitioned physically, to determine where each logic block should be placed, to determine how each logic block should be shaped, etc, for a final physical design implementation for the circuit.

FIG. 6A illustrates an exemplary computer controlled flow chart 30 showing use of genomes to create the physical design implementation in accordance with an embodiment of the present invention. In an embodiment, the electronic design tool 1000 (FIG. 9) performs flow chart 30. It is appreciated that flow chart 30 may be implemented in accordance with a computer system executing software to realize the various functions described herein.

Figure 7:
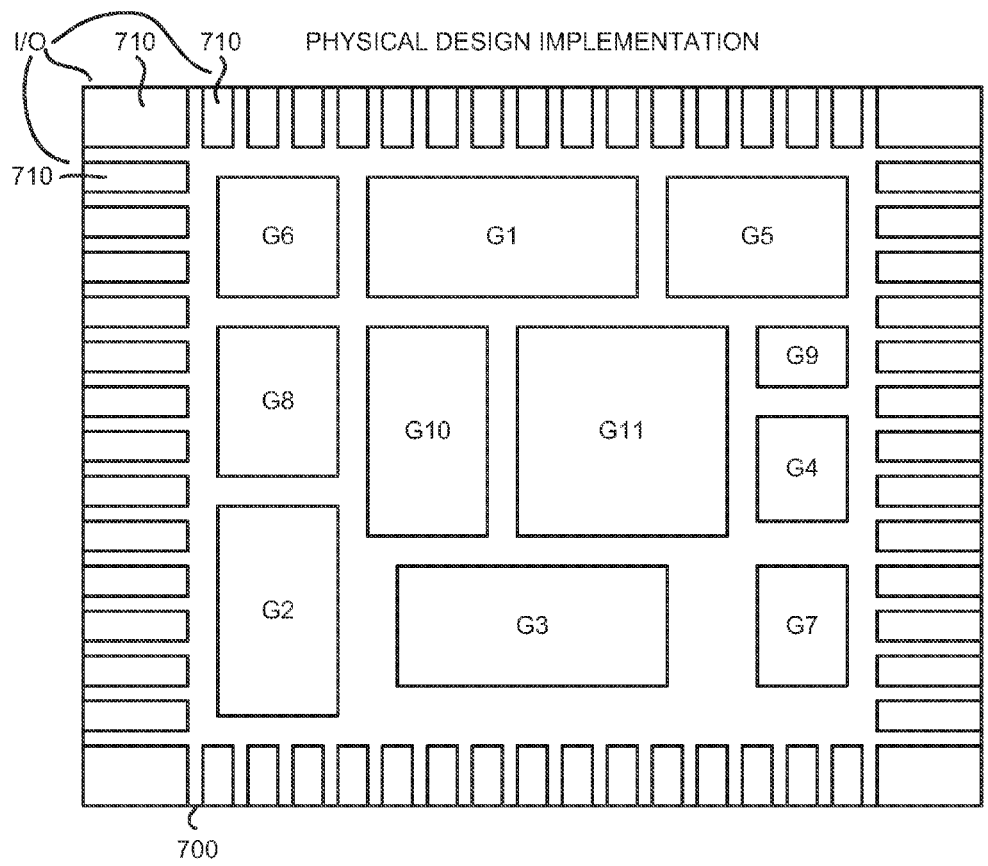
FIG. 7 illustrates a physical design implementation based on genomes in accordance with an embodiment of the present invention.

At Block 610, the genomes are placed. At Block 620, the genomes are routed. This placement and routing creates the physical design implementation (or physical layout). FIG. 7 illustrates a physical design implementation 700 based on genomes in accordance with an embodiment of the present invention. As depicted in FIG. 7, the physical design implementation 700 includes genomes G1-G11 and I/O components 710. The routed metal wires between genomes are not shown, as well as buffering of the routed metal wires is not shown. If a macro (e.g., RAM, CPU core, etc.) is synthesized from the functional description, the macro would be placed and routed with the genomes G1-G11.

The physical design implementation 700 is modified over multiple iterations to meet the design constraints. The genomes G-G11 are dynamic and adaptive to ensure meeting the design constraints.

Continuing with FIG. 6A, at Block 630 it is determined whether the physical design implementation has met the design constraints. Physical design information of the physical design implementation is utilized to determine whether the design constraints have been met. If the design constraints have not been met, the genomes (e.g., genomes G1-G11 of FIG. 7) are manipulated (discussed with respect to FIGS. 6B and 8A-8F) to meet the design constraints, at Block 640. If the design constraints have been met, gate placement information for each genome is generated for distribution to a final physical design implementation, at Block 650. Ideally, the size of the genomes is such that the effect of routing metal wire between the gates within the genomes is negligible in meeting the design constraints. Further, a gate-level implementation (or gate-level netlist) of the physical design implementation is generated for use in the final physical design implementation, at Block 660.

Figure 6B:
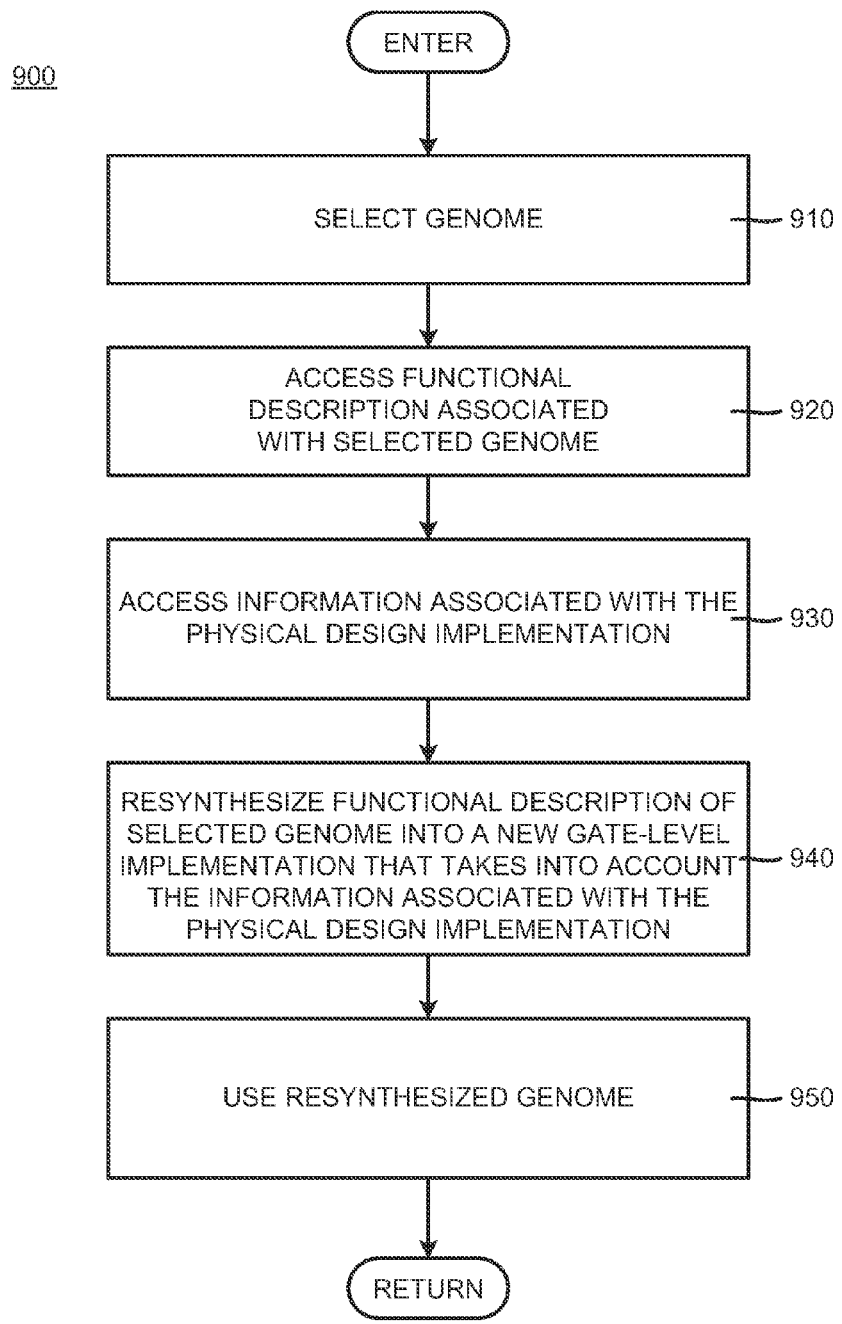
FIG. 6B illustrates an exemplary flow diagram showing resynthesis of a genome of a physical design implementation in accordance with an embodiment of the present invention.

FIG. 6B illustrates an exemplary flow chart 900 showing resynthesis of a genome of a physical design implementation in accordance with an embodiment of the present invention. In an embodiment, the electronic design tool 1000 (FIG. 9) performs flow chart 900. It is appreciated that flow chart 900 may be implemented in accordance with a computer system executing software to realize the various functions described herein.

At Block 910, a genome is selected to facilitate the physical design implementation meeting a plurality of design constraints. The genome includes a portion of the functional description of the circuit that has been synthesized into a gate-level implementation.

Continuing at Block 920, the functional description associated with the selected genome is accessed. At Block 930, information associated with the physical design implementation is accessed. Design constraints and physical design information are examples of information associated with the physical design implementation. Areas of congestion, placement of genomes, placement of gates within genomes, grouping of gates within genomes, and routing paths are examples of physical design information.

Further, at Block 940, the functional description associated with the selected genome is resynthesized into a new gate-level implementation that takes into account information associated with the physical design implementation. At Block 950, the resynthesized genome is utilized in the physical design implementation. This process may be repeated several times to meet the design constraints.

Figure 8A:
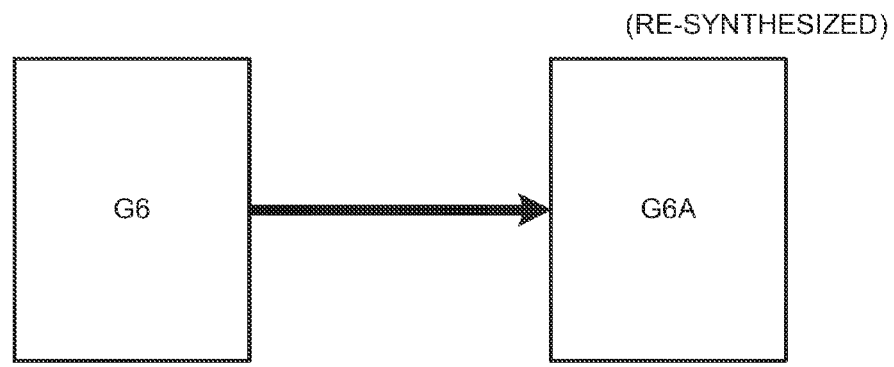
FIGS. 8A-8F illustrate various manipulations of exemplary genomes in accordance with an embodiment of the present invention.

FIGS. 8A-8F illustrate various manipulations of genomes (from FIG. 7) to meet design constraints in accordance with an embodiment of the present invention. FIG. 8A shows that the functional description associated with genome G6 may be resynthesized into a new gate-level implementation. Also, the gate-level implementation of the genome G6 may be modified.

Figure 8B:
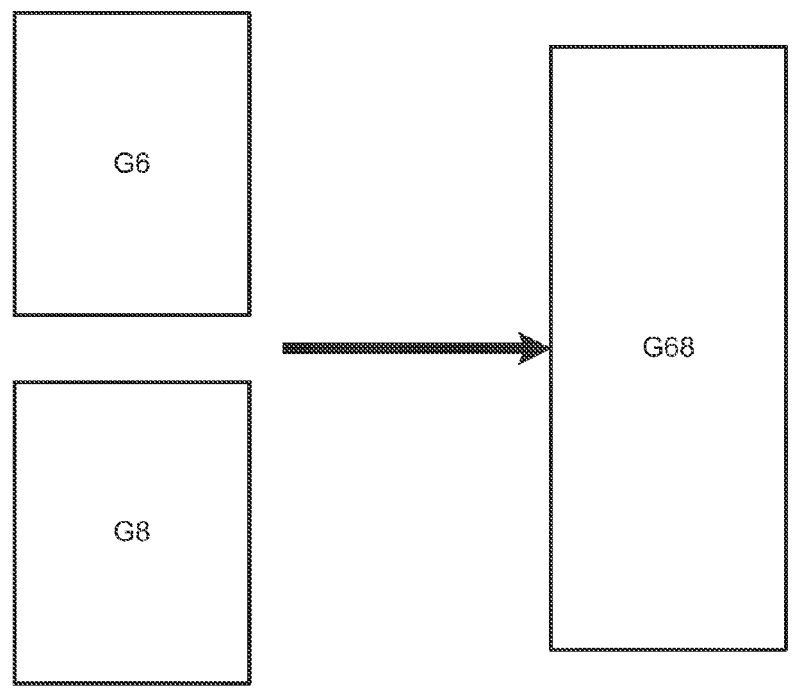
Figure 8C:
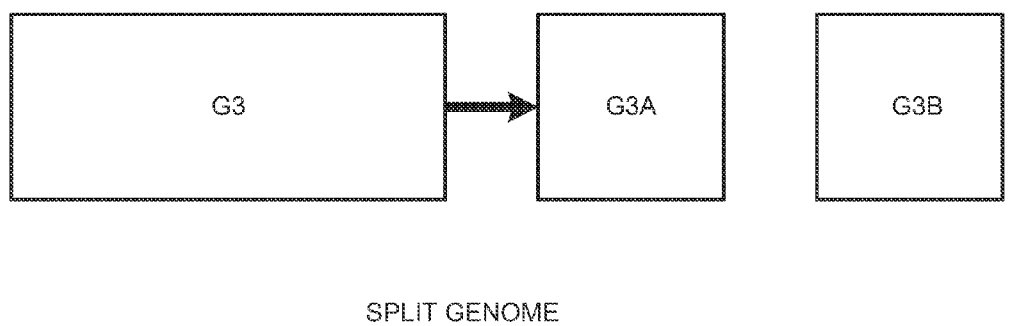
Figure 8D:
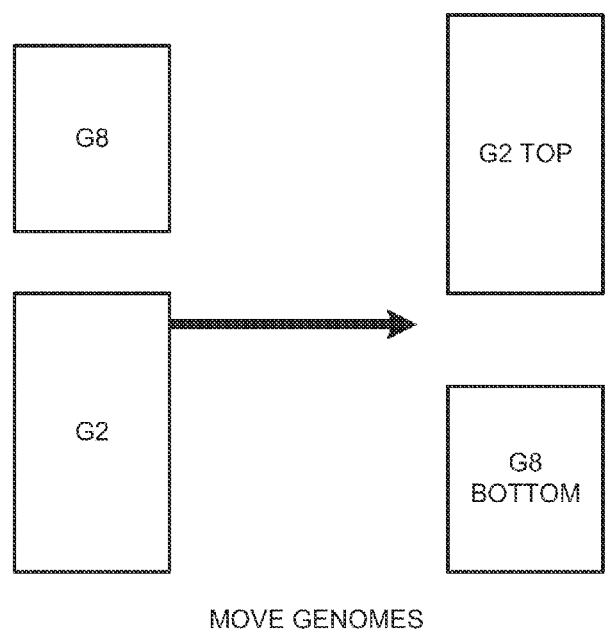
Figure 8E:
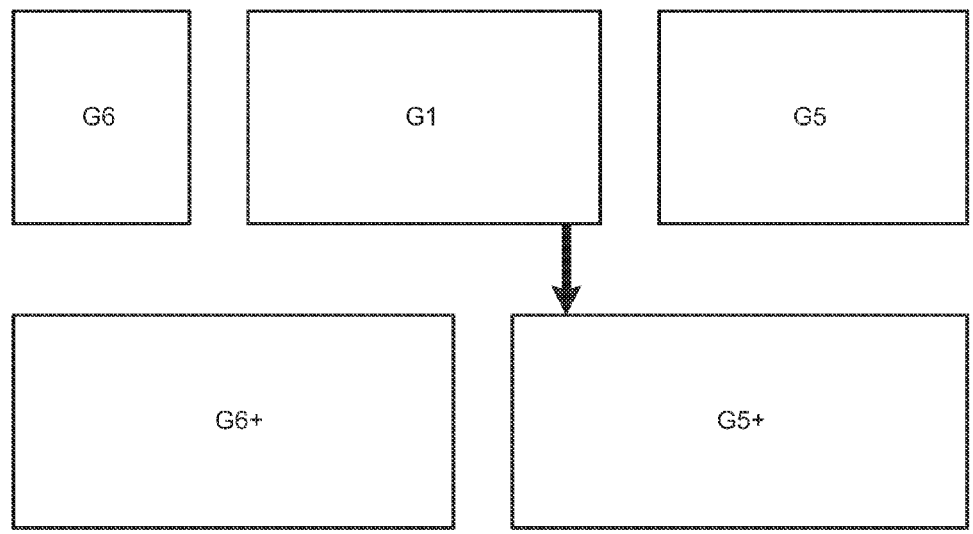
Figure 8F:
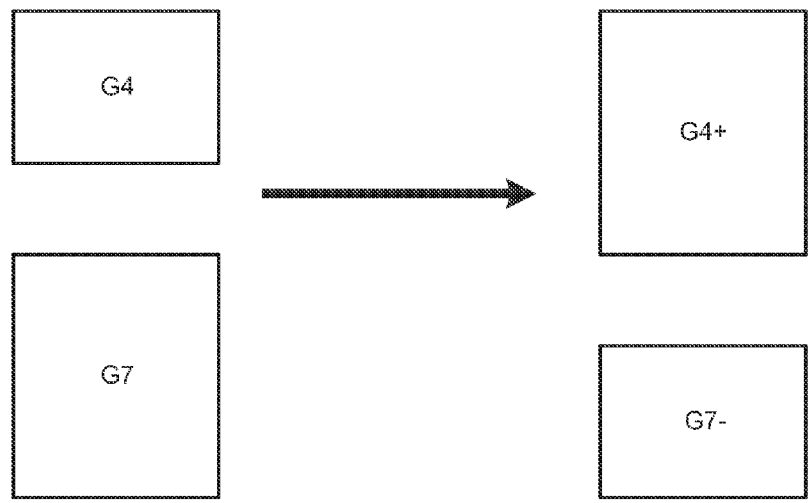

FIG. 8B shows genomes G6 and G8 may be merged to form genome G68. Further, FIG. 8C illustrates genome G3 may be split into genomes G3a and G3b. Also, FIG. 8D shows that genomes G8 and G2 may be moved to new positions illustrated by genomes G2top and G8bottom. Moreover, FIG. 8E shows genome G1 may be split and merged into genomes G6 and G5 to form genomes G6+ and G5+. Furthermore, FIG. 8F illustrates that genomes G4 and G7 may be resized to form genomes G4+ and G7-. It should be understood that other manipulations of genomes are possible.

Figure 9:
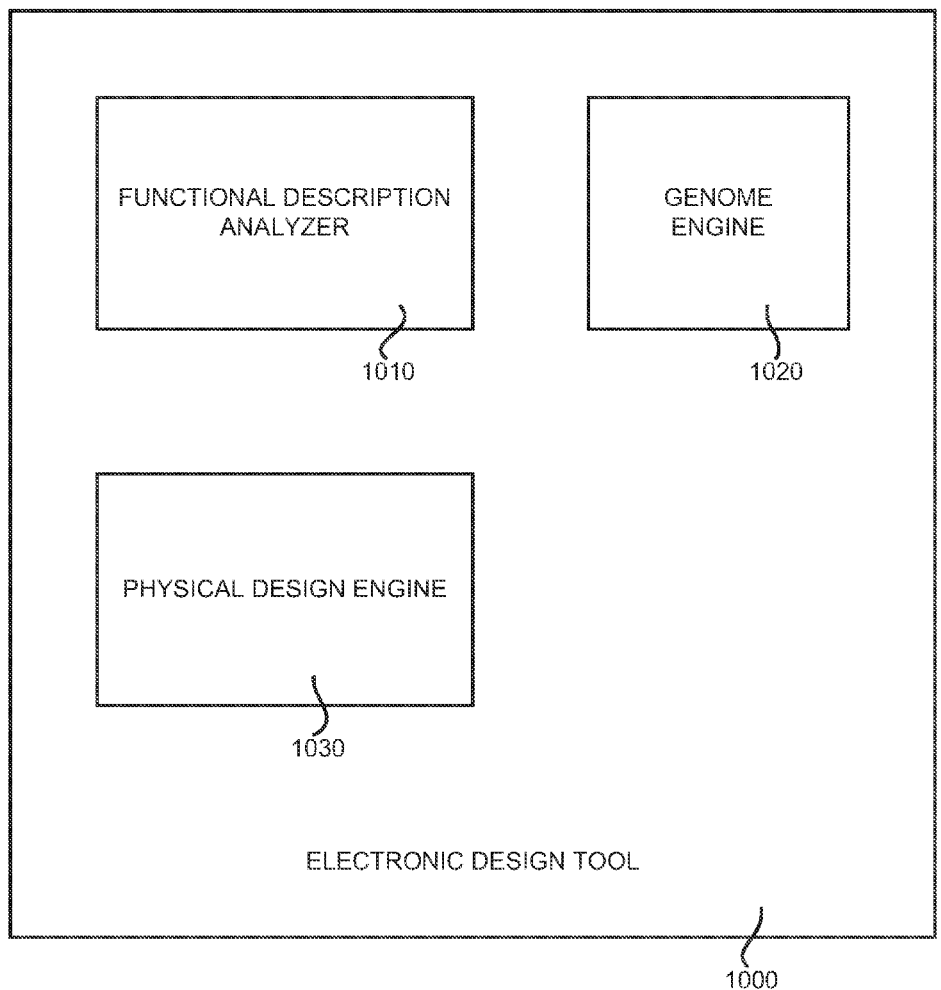
FIG. 9 illustrates an electronic design tool in accordance with an embodiment of the present invention.

FIG. 9 illustrates an electronic design tool 1000 in accordance with an embodiment of the present invention.

The electronic design tool 1000 includes a functional description analyzer 1010 configured to facilitate partitioning a functional description of a circuit into a plurality of genomes based on a plurality of rules. Further, the electronic design tool 1000 has a genome engine 1020 configured to create and manage a plurality of genomes, wherein each genome includes a portion of the functional description of the circuit that has been synthesized into a gate-level implementation. Also, the electronic design tool 1000 includes a physical design engine 1030 configured to use the genomes to create a physical design implementation for the circuit that meets a plurality of design constraints. If the design constraints are met, physical design information of the physical design implementation is useable for a final physical design implementation for the circuit.

In an embodiment, the invention is configured as computer-executable instructions stored in a computer-readable medium, such as a magnetic disk, CD-ROM, an optical medium, a floppy disk, a flexible disk, a hard disk, a magnetic tape, a RAM, a ROM, a PROM, an EPROM, a flash-EPROM, or any other medium from which a computer can read.

Refer to FIG. 10 which illustrates a computer system 112 which may be used as a platform to realize various embodiments of the present invention. Within the following discussions of the present invention, certain processes and steps are discussed that may be realized, in one embodiment, as a series of instructions (e.g., software program) that reside within computer readable memory units of system 112 and executed by processors of system 112. When executed, the instructions cause the computer system 112 to perform specific actions and exhibit specific behavior which is described in detail above.

In general, computer system 112 comprises an address/data bus 100 for communicating information, one or more central processors 101 coupled with the bus 100 for processing information and instructions, a computer readable volatile memory unit 102 (e.g., random access memory, static RAM, dynamic, RAM, etc.) coupled with the bus 100 for storing information and instructions for the central processor(s) 101, a computer readable non-volatile memory unit (e.g., read only memory, programmable ROM, flash memory, EPROM, EEPROM, etc.) coupled with the bus 100 for storing static information and instructions for the processor(s) 101. System 112 also includes a mass storage computer readable data storage device 104 (hard drive or floppy) such as a magnetic or optical disk and disk drive coupled with the bus 100 for storing information and instructions.

Optionally, system 112 can include a display device 105 coupled to the bus 100 for displaying information to the computer user, an alphanumeric input device 106 including alphanumeric and function keys coupled to the bus 100 for communicating information and command selections to the central processor(s) 101, a cursor control device 107 coupled to the bus for communicating user input information and command selections to the central processor(s) 101, and a signal generating device 108 coupled to the bus 100 for communicating command selections to the processor(s) 101.

The foregoing descriptions of specific embodiments have been presented for purposes of illustration and description. They are not intended to be exhaustive or to limit the disclosure to the precise forms disclosed, and obviously many modifications and variations are possible in light of the above teaching. The embodiments were chosen and described in order to best explain the principles of the disclosure and its practical application, to thereby enable others skilled in the art to best utilize the disclosure and various embodiments with various modifications as are suited to the particular use contemplated. It is intended that the scope of the disclosure be defined by the claims appended hereto and their equivalents.

What is claimed is:

1. A method of designing an integrated circuit, comprising:
    receiving a functional description of said integrated circuit;
    placing and routing, using a computer, a plurality of synthesized entities to create a physical design implementation for said integrated circuit, wherein each synthesized entity of said plurality of synthesized entities comprises a portion of said functional description of said integrated circuit that has been synthesized into a gate-level implementation; and
    manipulating said plurality of synthesized entities to facilitate said physical design implementation satisfying a plurality of design constraints, wherein said manipulating comprises using physical design information of said physical design implementation to ensure satisfying said plurality of design constraints.

2. The method of claim 1, wherein said manipulating said plurality of synthesized entities further comprises:
    performing integrated circuit chip level analysis for area, timing and power constraints using aggregate characteristics of said plurality of synthesized entities; and
    modifying said plurality of synthesized entities using said integrated circuit chip level analysis to satisfy said design constraints.

3. The method of claim 1, wherein said manipulating said plurality of synthesized entities comprises: merging a first synthesized entity with a second synthesized entity.

4. The method of claim 1, wherein said manipulating said plurality of synthesized entities comprises: splitting synthesized entity into two or more synthesized entities.

5. The method of claim 1, wherein said manipulating said plurality of synthesized entities comprises: moving synthesized entity from one location to another location.

6. The method of claim 1, wherein said manipulating said plurality of synthesized entities comprises: changing size of one or more synthesized entities.

7. The method of claim 1, wherein said manipulating said plurality of synthesized entities comprises: modifying said gate-level implementation of synthesized entity.

8. The method of claim 1, wherein said manipulating said plurality of synthesized entities comprises: resynthesizing said functional description of synthesized entity into a new gate-level implementation.

9. The method of claim 1, further comprising:
    providing a global level view of said physical design implementation using said plurality of synthesized entities to enable said global level view, wherein said global level view ensures satisfying said design constraints.

10. A computer-readable storage device comprising a plurality of computer-executable instructions stored therein, said computer-executable instructions comprising:
    instructions to receive a functional description of an integrated circuit;
    instructions to place and route a plurality of synthesized entities to create a physical design implementation for said integrated circuit, wherein each synthesized entity of said plurality of synthesized entities comprises a portion of said functional description of said integrated circuit that has been synthesized into a gate-level implementation; and
    instructions to manipulate said plurality of synthesized entities to facilitate said physical design implementation satisfying a plurality of design constraints, wherein said instructions to manipulate comprise instructions to use physical design information of said physical design implementation to ensure satisfying said plurality of design constraints.

11. The computer-readable storage device of claim 10, wherein said instructions to manipulate said plurality of synthesized entities further comprise:
   instructions to perform integrated circuit chip level analysis for area, timing and power constraints using aggregate characteristics of said plurality of synthesized entities;
   instructions to modify said plurality of synthesized entities using said integrated circuit chip level analysis to satisfy said design constraints; and
   instructions to resynthesize said functional description of synthesized entity into a new gate-level implementation.

12. The computer-readable storage device of claim 10, wherein said instructions to manipulate said plurality of synthesized entities comprise:
   instructions to modify said gate-level implementation of synthesized entity.

13. The computer-readable storage device of claim 10, wherein said instructions to manipulate said plurality of synthesized entities comprise:
   instructions to merge a first synthesized entity with a second synthesized entity.

14. The computer-readable storage device of claim 10, wherein said instructions to manipulate said plurality of synthesized entities comprise:
   instructions to split synthesized entity into two or more synthesized entities.

15. The computer-readable storage device of claim 10, wherein said instructions to manipulate said plurality of synthesized entities comprise:
   instructions to move synthesized entity from one location to another location.

16. The computer-readable storage device of claim 10, wherein said instructions to manipulate said plurality of synthesized entities comprise:
   instructions to change size of one or more synthesized entities.

17. The computer-readable storage device of claim 10, wherein said computer-executable instructions further comprise:
   instructions to provide a global level view of said physical design implementation using said plurality of synthesized entities to enable said global level view, wherein said global level view ensures satisfying said design constraints.

18. An electronic design tool comprising:
   a functional description analyzer configured to facilitate partitioning a functional description of an integrated circuit into a plurality of entities based on a plurality of rules; and
   an entity engine configured to create and manage a plurality of synthesized entities, wherein each synthesized entity comprises a portion of said functional description of said integrated circuit that has been synthesized into a gate-level implementation.

19. The electronic design tool of claim 18, further comprising: a physical design engine configured to use said synthesized entities to create a physical design implementation for said integrated circuit that meets a plurality of design constraints.

20. The electronic design tool of claim 18, wherein if said design constraints are met, physical design information of said physical design implementation is useable for a final physical design implementation for said integrated circuit.

* * * * *